June 20, 1961 P. SISKIND 2,989,687

TWO-STAGE HALF-WAVE MAGNETIC AMPLIFIER

Filed Feb. 2, 1956 2 Sheets-Sheet 1

INVENTOR
PHILIP SISKIND
BY R. V. Craddock
ATTORNEY

TWO-STAGE HALF-WAVE MAGNETIC AMPLIFIER

Filed Feb. 2, 1956 2 Sheets-Sheet 2

INVENTOR
PHILIP SISKIND
BY R. V. Craddock
ATTORNEY

United States Patent Office 2,989,687

Patented June 20, 1961

2,989,687
TWO-STAGE HALF-WAVE MAGNETIC AMPLIFIER

Philip Siskind, Great Neck, N.Y., assignor to Sperry Rand Corporation, a corporation of Delaware Filed Feb. 2, 1956, Ser. No. 563,098
14 Claims. (Cl. 323—66)

This invention relates to magnetic amplifiers, and more particularly concerns an improved two-stage magnetic amplifier of the half-wave type.

In conventional two-stage half-wave magnetic amplifiers, the first and second stages generally include respective pairs of cores. The first stage cores are provided with load windings in which half-wave load currents are developed and combined in a connection across a pair of serially-connected control windings, one on each second stage core. Thus, both second stage cores are driven simultaneously by the net output of the first stage.

In the present amplifier, one first stage core and associated load winding drive only one second stage core, while the other first stage core and associated load winding drive only the other second stage core. By this arrangement of interstage coupling, the cross-coupling or unbalance coupling both of one stage to the other and of one core to the other in each stage is substantially reduced over that which exists in the conventional arrangement.

The cross-coupling obtained with serially-connected second stage control windings generally provides some positive feedback to the first stage due to so-called circulating load currents known to develop in the second stage. However, the feedback thus provided, hence the increase in gain it produces, is characteristically unpredictable and difficult to control. On the other hand, readily controlled positive feedback is provided in the present invention by coupling an intermediate tap on one of the first stage load windings through a preselected resistor to a corresponding tap on the other first stage load winding.

Additional features of the present invention include a novel negative feedback arrangement for shaping the transfer characteristic of the amplifier apparatus to provide high stability over a preselected range of rates of change of the signal input. A novel arrangement is also included for providing D.C. bias for the second stage without the necessity of one or more separate windings therefor. A further novel arrangement is included for providing complete control of the bias level of the first stage by the introduction of an adjustable voltage between the common junction of the first stage rectifiers and an intermediate tap on a resistor connected across the respective outer terminals of the rectifiers.

Figure 1:
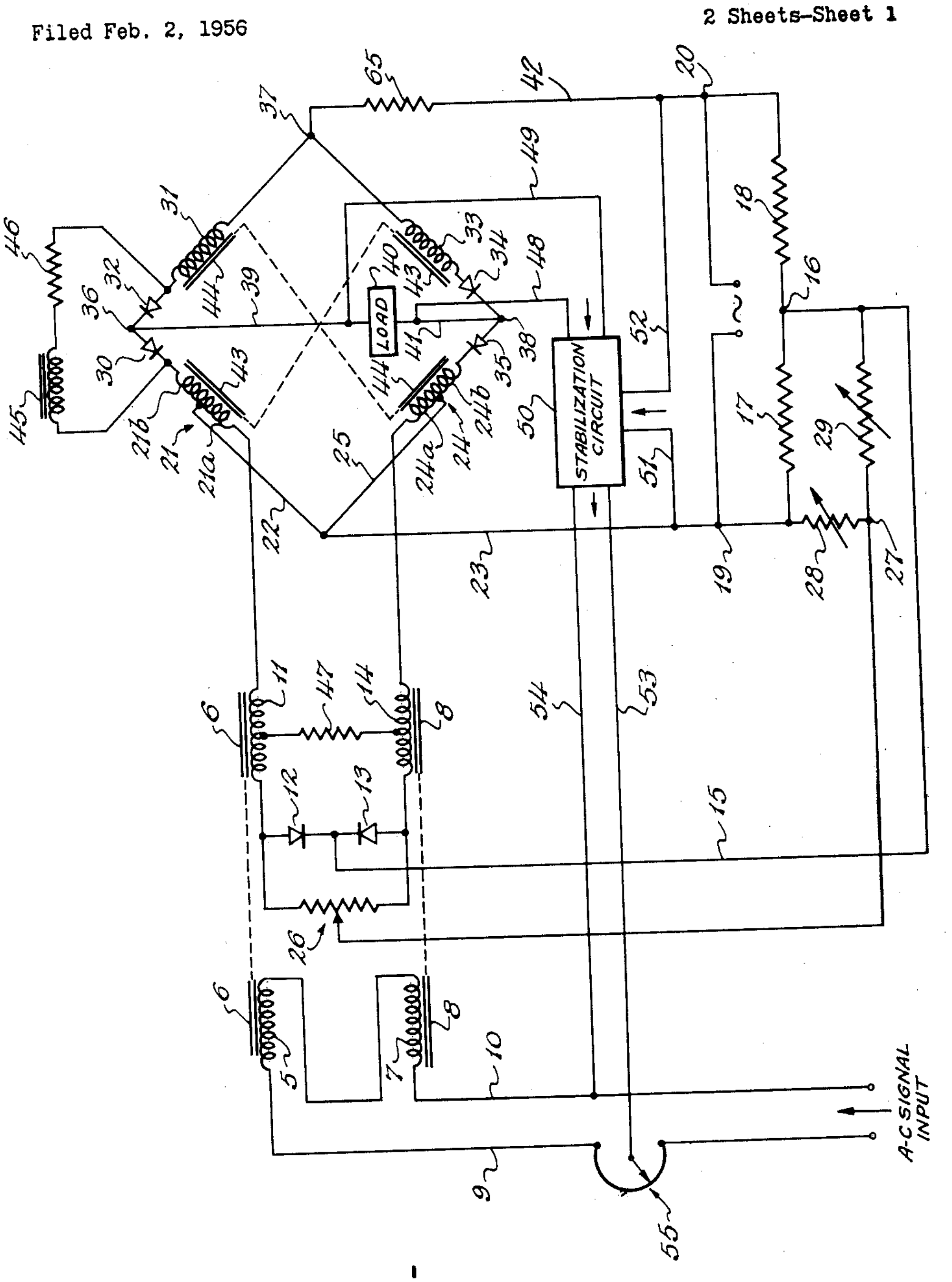
Figure 2:
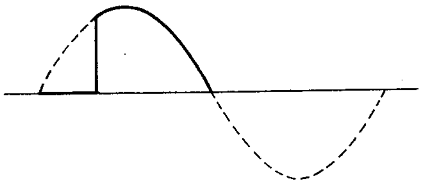
Figure 6:
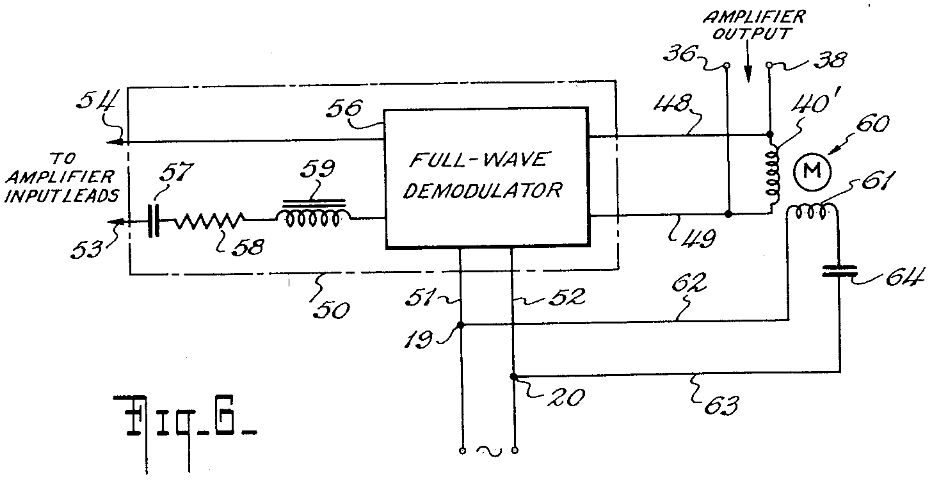

The foregoing and still other features of the present invention will become more readily apparent by referring to the description below and the accompanying drawings, in which FIG. 1 is a schematic diagram of a preferred embodiment of the present amplifier apparatus;

FIGS. 2–5 are diagrammatic representations of waveforms depicting the character of different currents obtainable in the present apparatus; and, FIG. 6 is a more detailed schematic diagram of preferred forms of the stabilization and output load circuits of FIG. 1.

Referring to FIG. 1, the first stage or preamplifier stage of the present amplifier includes a control winding 5 wound on a saturable core 6 of magnetic material and a control winding 7 wound of a similar core 8. Control windings 5, 7 are connected in series across a pair of leads 9, 10 which are assumed for exemplary purposes to be energized by a source of reversible phase alternating current signal, which source, for example, may be another amplifier, or a synchro receiver such as is usually employed in data transmission systems, or other suitable source. A load winding 11 is wound on core 6 and has one of its sides connected by way of a series connection of oppositely-poled rectifying elements 12, 13 to one of the sides of a load winding 14 wound on core 8. The common junction of rectifying elements 12 13 is connected via a lead 15 to the midtap 16 of a voltage divider formed of resistors 17, 18 connected across the terminals 19, 20 of a power source of alternating current having the frequency of the signal carrier on input leads 9, 10.

The other side of load winding 11 is connected to one side of a control winding **21*a* for the second stage or power stage of the present amplifier, while the other side of the control winding 21*a*, i.e., the tap of winding 21, is connected via leads 23, 23 to power terminal 19. Hence, rectifier 12, load winding 11, and control winding 21*a* form a series branch connected across divider resistor 17. Similarly, the other side of load winding 14 is connected to one side of a control winding 24*a* for the second amplifier stage, while the other side of the control winding 24*a*, i.e., the top of winding 24, is connected via leads 25, 23 to power terminal 19. Hence, rectifier 13, load winding 14, and control winding 24*a* also form a series branch connected across divider resistor 17. Therefore, with respect to each other, the two series branches thus formed are excited in parallel from the divided portion of the power source across resistor 17, and the rectifiers 12 and 13, being similarly poled with respect to voltage supplied across the branches, are conductive on half cycles of the same polarity of the supply voltage. Moreover, control winding 21*a* of the second stage is the load for load winding 11 of the first stage, and control winding 24*a* of the second stage is the load for load winding 14** of the first stage.

The bias level of the first stage is controlled by adjusting the voltage level from the point to which the arm of a balancing potentiometer 26 connected across rectifiers 12, 13 is returned. Conventionally, this point is at the common junction or center tap of the first stage rectifiers. However, in the present amplifier, this point is at the junction 27 of a pair of adjustable resistors 28, 29 forming a voltage divider across divider resistor 17. Thus, the potential of junction 27, namely the voltage drop across resistor 29, may be adjusted by adjusting the relative values of resistors 28, 29. The advantage of this biasing arrangement over the conventional arrangement of merely shunting the first stage rectifiers with resistors is that it permits bias in the upward direction as well as in the downward direction, rather than in the downward direction alone.

If the first stage signal input on leads 9, 10 is zero, there is no control current through windings 5, 7. Under this condition and when power terminal 19 goes positive, load windings 11, 14 are energized to saturate the cores 6, 8 at the same time, whereupon during every half cycle when terminal 19 is positive, equal average currents flow through these windings of the form depicted in FIG. 2. Then, equal average currents also flow through the control windings **21*a*, 24*a*** of the second stage, producing on the next half-cycle, for reasons that will become apparent, a zero output from the second stage.

Figure 3:
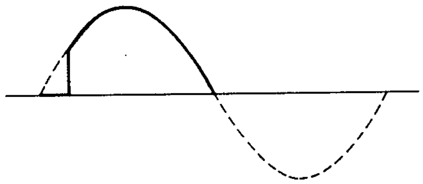
Figure 4:
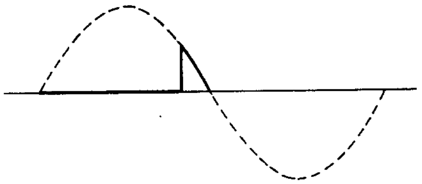
Figure 5:
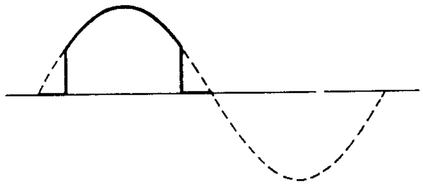

Control windings 5, 7 are so wound on their respective cores that one control winding advances the saturation produced by its associated load winding, while the other retards the saturation produced by its associated load winding, or vice versa, depending on the phase of the control signal on input leads 9, 10. Thus, assuming, when the control signal is such as to make lead 9 positive concurrently with terminal 19, that an aiding flux is produced in core 6 by control winding 5, then load current (as depicted in FIG. 3) flows through load winding 11 and the second stage control winding 21a sooner than it does with zero control signal, while load current (as depicted in FIG. 4) flows through load winding 14 and the second stage control winding 24a later than it does with zero control signal.

The second stage is such as to produce an output in response to a control signal on the first stage input leads 9, 10 only during the power half-cycles alternate to those during which first stage load currents flow in the second stage control windings 21a, 24a. Moreover, this output is dependent upon the difference between the average values of such load currents, so that the effective control current for the second stage is the current difference shown in FIG. 5, which would be the waveform across control windings 21a, 24a.

On the half-cycle of control signal and power supply making both lead 9 and terminal 19 negative, the flux level or bias in cores 6, 8 returns to a set value predetermined by the position of wiper arm 26 and the values of divider resistors 28, 29. During this half-cycle, cores 6, 8 are unsaturated and the resultant high circuit impedance substantially prevents current from flowing through the second stage control windings 21a, 24a, whereby the first stage operates in a half-wave manner.

Should the phase of the input signal on leads 9, 10 reverse, load current then flows through control winding 24a in advance of load current through control winding 21a, thereby to reverse the polarity of the effective control signal to the second stage.

The remainder of the second stage of the present amplifier comprises four load winding branches connected in bridge fashion. A first branch is formed of a load winding 21b in series with a rectifier element 30, the second branch is formed of a load winding 31 in series with a rectifier element 32, the third branch is formed of a load winding 33 in series with a rectifier element 34, and the fourth branch is formed of a load winding 24b in series with a rectifier element 35. The first and second branches are connected to a common terminal 36, the second and third branches to a common terminal 37, the third and fourth branches to a common terminal 38, and the fourth branch is connected via leads 25, 22 to the first branch.

The second stage control and load windings 21a, 21b preferably make up one winding 21 whose control and load portions are on opposite sides of the connection of lead 22 thereto. Similarly, the second stage control and load windings 24a, 24b preferably make up one winding 24 whose control and load portions are on opposite sides of the connection of lead 25 thereto.

A lead 39 is connected from bridge terminal 36 to one side of a load 40 whose other side is connected via a lead 41 to bridge terminal 38, thus forming one diagonal of the load winding bridge. The other diagonal of the bridge is connected across the power terminals 19, 20 by means of lead 23 from the junction of leads 22, 25 to terminal 19 on the one hand, and by means of a lead 42 including a counterload resistor 65 connected to terminal 20 on the other hand.

Windings 21, 33 are wound on the same magnetic core 43, while windings 31, 24 are wound on the same magnetic core 44. Thus, cores 6, 8 of the first stage respectively drive cores 43, 44 of the second stage. The effect of this unconventional arrangement of interstage coupling is to minimize the cross-coupling or unbalance coupling both of one stage to the other and of one core to the other in each stage.

Rectifiers 32 and 30 are poled so that their low forward impedances are respectively directed toward and away from bridge terminal 36, while rectifiers 33 and 35 are poled so that their low forward impedances are respectively directed toward and away from bridge terminal 38. The four second stage rectifiers are poled to conduct current on half cycles of the same polarity. These rectifiers are similarly poled with respect to A.C. supplied to the power input of the second stage at terminal 37 and the junction of leads 22 and 25. It can also be seen that the rectifiers in each of the four sets of adjacent pairs of bridge branches are oppositely related with respect to the load 40. For example, rectifiers 30 and 32 are oppositely related with respect to the load, as also are rectifiers 32 and 34.

In order to provide bias for the second stage, rectifiers 32 and 30 are shunted by a low pass filter formed of a serially-connected reactor 45 and resistor 46. The impedance shunt thus formed, rather than a conventional resistor shunt, biases the flux level set in cores 43, 44 during the conducting half cycle of the first stage. The presence of reactor 45 attenuates the alternating components of current in windings 21b, 31 so that the bias is established only by the average D.C. level of this current. Thus, any tendency to short out an A.C. component or a load component is avoided, and the phasing problems generally inherent in the use of A.C. bias derived from a solely resistive shunt are eliminated. Moreover, D.C. bias is provided without the necessity of one or more separate windings for this purpose.

During the half-cycle when terminal 20 goes positive, the cores 43, 44 will both reach saturation at the same time, provided that equal average load currents flowed through the second stage control windings 21a, 24a during the preceding half-cycle when terminal 19 was positive, i.e., for a condition of zero input signal to the first stage. In the event, however, that these average load currents were unequal, one of the cores 43, 44 (depending on the phase of the first stage signal input) will thereby have had its flux level set closer to saturation than the other just prior to terminal 20 going positive. Hence, that one of cores 43, 44 closer to saturation will have its windings conduct second stage load or output current prior to any tendency of the windings of the core further from saturation to conduct equal current in the opposite direction through load 40. When the core further from saturation finally reaches saturation sometime in the latter part of the half-cycle (terminal 20 still positive), the bridge is thereby balanced and current ceases to flow through the load.

Assuming the input signal to be of such phase as to cause the saturation of core 6 prior to core 8 on the conducting half-cycle of the first stage, core 43 (being driven by core 6 and therefore being closer to saturation than core 44 driven by core 8) saturates first on the succeeding half-cycle. Upon this event, a relatively large load current flows via the third branch, load 40, and the first branch until core 44 saturates to produce a tendency for a cancelling load current to flow via the second branch, load 40, and the fourth branch. Thus, second stage output current flows through load 40 from terminal 38 to terminal 36 starting with the saturation of core 43 and ending with the saturation of core 44. The output of the second stage, therefore, is of the waveform depicted in FIG. 5, this being the reason why this waveform was hereinbefore set forth as descriptive of the character of the "effective" control current for the second stage.

Should the phase of the input control signal reverse, whereby core 44 is saturated prior to core 43 on the half-cycle when terminal 20 goes positive, a relatively large load current flows via the second branch, load 40, and the fourth branch until core 43 saturates to produce a cancelling load current. Thus, current flows through load 40 during portions of alternate half-cycles in response to a signal input on leads 9 and 10, and has a polarity or directional sense dependent on the input's phase.

The second stage control windings 21a, 24a have some second stage load components induced therein which are preferably employed for controlled positive feedback purposes in the first stage by connecting a resistor 47 from a tap on the first stage load winding 11 to a tap on the first stage load winding 14. In this regard, as far as the circulating load current components in control windings 21*a*, 24*a* are concerned, load windings 11, 14 effectively serve as control windings for the first stage. Whereas positive feedback is present to a haphazard extent with conventional interstage coupling employing serially-connected second stage control windings, the positive feedback obtained in the present amplifier is readily controlled by the selection and positioning of resistor 47.

Negative feedback is provided in the present amplifier for loop stabilization purposes by feeding the second stage output obtained from across load 40 via a pair of leads 48, 49 to a stabilization circuit 50 as one input thereof. A second input is obtained from power terminals 19 and 20 via leads 51 and 52, respectively. The output of stabilization circuit 50 is fed back in degenerative fashion to signal input leads 9 and 10 via leads 53 and 54, respectively. The connection of feedback lead 53 to input lead 9 is preferably made through a simple potentiometer 55 for adjustment purposes.

Stabilization circuit 50 is shown in greater detail in FIG. 6. It comprises both a full-wave demodulator 56 for demodulating the amplifier output and a series combination of a capacitor 57, a resistor 58, and a reactor 59, which combination is included in lead 53 for shaping the transfer characteristic of the amplifier to provide the desired loop stability. FIG. 6 also depicts the load 40 (FIG. 1) as comprising the control field winding 40′ of a two-phase induction type servomotor 60 having its fixed field winding 61 connected across power supply terminals 19, 20 via a pair of leads 62, 63 one of which includes a serially-connected phasing capacitor 64.

The parameter group 57–59 provides a low Q feedback circuit which prevents a feedback when the input signal doesn't change, i.e., when the signal frequency, as distinguished from the carrier frequency, is zero. Thus, at zero signal frequency, the overall gain of the amplifier is not affected by negative feedback. However, the parameter group 57–59 is such as to pass maximum feedback in the region of servo crossover, i.e., the middle frequency region where the phase margin of the servo is attained. Thus, the amplifier transfer characteristic in this region is made highly stable, and the stability of the complete servo-loop is, therefore, substantially independent of the gains of the individual stages of the amplifier. Reactor 59 has the additional purpose of keeping the carrier frequency impedance high looking into the stabilization circuit, so that there is no attenuation of the input signal due to this impedance.

While it has been assumed for exemplary purposes that the control windings 5, 7 (FIG. 1) are energized by a source of reversible phase alternating current, it will be apparent to those skilled in the art that similar operation of the present amplifier apparatus would result from the use of a variable D.C. signal source. In this regard, the magnitude and polarity of the D.C. signal would determine the magnitude and polarity of the current through the load 40. Therefore, in either event, the output polarity is governed by the sense of the input signal where such sense is the polarity of a D.C. signal and the phase of an A.C. signal.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. An amplifying system comprising first and second magnetic amplifier stages, magnetic core means for the first stage, first and second magnetic cores for the second stage, control winding means and first and second load windings on said magnetic core means, input drive means for the first stage responsive to signals of variable sense and including said control winding means for unequally driving the respective load windings of the first stage in response to a signal of any given sense, a pair of load windings and a control winding on each of said second stage cores, a first rectifier and one only of said second stage control windings being connected in series with one of said first stage load windings to form a first circuit branch, a second rectifier and the other only of said second stage control windings being connected in series with the other of said first stage load windings to form a second circuit branch, said first and second circuit branches being connected in parallel to be energized by A.C. of a given frequency, said first and second rectifiers being similarly poled to conduct on half cycles of a given polarity of applied A.C., said first and second circuit branches being so relatively arranged as to conduct equal average load currents during each half cycle of said given polarity of their alternating current energization, except when the input drive means of said first stage control windings are energized by a signal voltage, the average load current in said first branch being greater than in said second branch for one polarity of said signal voltage and vice versa for the other polarity, a plurality of rectifiers respectively connected one in series with each of said second stage load windings to form four circuit arms, said circuit arms being connected in bridge-like fashion so that the respective ones of the load winding pair for one second stage core are in one pair of diagonally opposite circuit arms while the respective ones of the load winding pair for the other second stage core are in the other pair of diagonally opposite circuit arms, one diagonal of the bridge-connected circuit arms being for connection to a load, the other diagonal being a power supply input for receiving A.C. of said given frequency, said second stage rectifiers being poled to conduct on half cycles of the polarity opposite to said given polarity, said circuit arms being so relatively arranged that the respective cores thereof saturate at the same time during the non-conducting half-cycles of said first and second branches due to equivalent flux levels set therein when said average load currents conducted in said first and second branches are equal, and saturate at different times due to non-equivalent flux levels set therein when said average load currents are unequal, said bridge-connected circuit arms being electrically balanced when both cores thereof are saturated, and unbalanced when but one core is saturated, whereby half-wave output current flows through said load when said first stage control windings means is energized by a signal voltage.

2. Signal amplifying apparatus having first and second magnetic amplifier stages, said second stage comprising first, second, third and fourth load winding branches connected in bridge fashion, each pair of diagonally opposite second stage branches respectively having a magnetic core, a pair of control windings positioned respectively on said second stage cores, a load circuit connected across one diagonal of said bridge-connected windings, the other diagonal of said bridge-connected windings being a power input for receiving A.C. to supply power to said second stage, said first stage comprising first and second reactor branches connected in parallel to be energized by A.C., one of said first stage branches including one of said second stage control windings as the load thereof, the other of said first stage branches including the other of said second stage control windings as the load thereof, each of said first stage branches having a load winding with an intermediate tap, a resistor connected from the tap on one to that on the other of said first stage load windings, magnetic core means having wound thereon the latter load windings, and control winding means associated with said core means and adapted for connection to a signal source.

3. Amplifying apparatus comprising first and second half-wave magnetic amplifier stages, the second stage including first and second reactor branches, first and second magnetic cores one in each branch, a first load winding and associated control winding wound on the other of said cores, a load circuit connected to said load windings, and a rectifier in each branch, said rectifiers being poled to conduct on half cycles of a given polarity of power supply voltages applied to said branches, said rectifiers being oppositely related with respect to the load circuit, said first stage including third and fourth reactor branches connected in parallel for energization with A.C., each branch including in series a rectifier, a load winding with an intermediate tap, and a different one of said control windings, said third and fourth branch rectifiers being poled to conduct during half cycles of a polarity opposite to said given polarity, magnetic core means carrying the third and fourth branch load windings, input drive means for said first stage responsive to input signals of variable sense and including control winding means on said core means for unequally driving the respective branches of the first stage whereby said first stage unequally drives the respective second stage branches, the sense of said input signals determining which of the respective branches in each stage has the greater output at any given time, and a resistor connected from one to the other of said taps.

4. Signal amplifying apparatus having first and second half-wave magnetic amplifier stages arranged to provide their respective outputs on opposite half cycles of applied supply voltages, said second stage comprising branch means constituting a bridge having a load diagonal for connection to a load and a power input diagonal for connection to a source of A.C., said branch means including first and second magnetic cores and first and second reactor load winding means carried respectively by said first and second magnetic cores for controlling the current to said load, a pair of control windings positions respectively one on each of said second stage cores, said first stage comprising first and second parallel connected load winding branches connected to power input means for receiving alternating current, each branch including a rectifier and in series therewith a reastor load winding with an intermediate tap, said rectifiers of the first stage branches being similarly poled with respect to voltages applied across the branches, one of said first stage branches including one of said second stage control windings as the load thereof, the other of said first stage branches including the other of said second stage control windings as the load thereof, magnetic core means for carrying the reactor load windings of said first stage branches, input drive means for said first stage responsive to signals of variable sense and including control winding means associated with said first stage core means for providing unequal drive to the respective first stage branches, which of the respective load winding means of the second stage has the greater output at any given time, and a resistor connected from the tap one one to the tap on the other of the first stage load windings.

5. Amplifying apparatus comprising first and second stage magnetic amplifiers, said second stage comprising supply input means for receiving A.C. supply, a load circuit, first and second saturable reactor branches connected to controllably supply power from said input means to said load circuit, each said branch including a magnetic core, a control winding on said core, a load winding on said core and a rectifier in series with said load winding, said rectifiers being similarly poled with respect to supply voltages applied to the supply input means, said rectifiers being oppositely poled with respect to said load circuit, said first stage amplifier comprising third and fourth saturable reactor branches connected in parallel for energization thereof with A.C. supply, each said third and fourth branches including in series a rectifier and a load winding with an intermediate tap, magnetic core means carrying the load windings of the third and fourth branches, said rectifiers in the third and fourth branches being conductive on half cycles of the same polarity of supply voltages applied across said branches, each of said first stage branches including as a load thereon a different one of said second stage control windings, input drive means for the first stage responsive to signals of variable sense and including control winding means associated with said first stage magnetic core means for unequally driving said respective third and fourth branches in response to a signal of any given sense, a resistor connected from one to the other of said taps, and means for supplying A.C. power of the same frequency to said first and second stages, the rectifiers of the respective first and second stages being conductive on half cycles of respectively opposite polarity of the applied supply voltages at any given time whereby control of the second stage is provided during the non-conductive half cycle of the second stage and the conductive half cycle of the first stage.

6. Signal amplifying apparatus having first and second magetic amplifier stages, said second stage comprising first, second, third and fourth impedance branches connected as a bridge having a load diagonal for connection to a load and a power input diagonal for connection to a source of A.C., said first and second branches being connected by a first common junction forming one side of said power input diagonal, said first branch including a first magnetic core and a first load winding carried by said first core, said second branch including a second magnetic core and a second load winding carried by said second core, a pair of control windings positioned respectively on said first and second cores, each branch including a rectifier, one side of each of said rectifiers in said first and third branches being connected by a second common junction which forms one side of said load diagonal, a circuit including in series a reactor and a resistor connected to the other sides of said first and third branch rectifiers for shunting these rectifiers, said first stage comprising fifth and sixth parallel connected impedance branches connected to power input means for receiving A.C., one of said first stage branches including a third load winding and one only of said second stage control windings as the load thereof, the other of said first stage branches including a fourth load winding and the other only of said second stage control windings as the load thereof, magnetic core means for carrying the third and fourth load windings, and control winding means associated with said magnetic core means and adapted for connection to a signal source.

7. Signal amplifying apparatus having first and second magnetic amplifier stages, said second stage comprising branch means constituting a bridge having a load diagonal for connection to a load and a power input diagonal for connection to a source of A.C., said branch means including first and second magnetic cores and first and second reactor load winding means carried respectively by the first and second magnetic cores for controlling the current to said load, a pair of control windings positioned respectively on said first and second cores, said first stage comprising first and second parallel connected load winding branches connected to power input means for receiving alternating current, each branch including a reactor load winding, one of said first stage branches including one of said second stage control windings as the load thereof, the other of said first stage branches including the other of said second stage control windings as the load thereof, magnetic core means for carrying the reactor load windings of said first stage branches, control winding means associated with said first stage core means and adapted for connection to a signal source, and a degenerative feedback connection from the load diagonal of the bridge to the first stage control windings, said connection comprising a demodulator for demodulating the fed-back output of the second stage and filter means for preventing feedback at zero control signal frequency while providing maximum feedback over a preselected band of control signal frequencies.

8. Signal amplifying apparatus having first and second magnetic amplifier stages, said second stage comprising branch means constituting a bridge having a load diagonal for connection to a load and a power input diagonal for connection to a source of A.C., said branch means including first and second magnetic cores and first and second reactor load winding means carried respectively by the first and second magnetic cores for controlling the current to said load, a pair of control windings positioned respectively on said second stage cores, said first stage comprising first and second parallel connected load winding branches connected to power input means for receiving alternating current, said power input means including a junction common to said first stage branches, each branch including in series a rectifier and a reactor load winding, like electrodes of said rectifiers being connected to said common junction, one of said first stage branches including one of said second stage control windings as the load thereof, the other of said first stage branches including the other of said second stage control windings as the load thereof, magnetic core means for carrying the reactor load windings of said first stage branches, control winding means associated with said first stage core means and adapted for connection to a signal source, a resistor shunted across said rectifier, said resistor having an intermediate tap, and means for connecting said junction and said tap across a current supply source.

9. Amplifying apparatus comprising first and second stage magnetic amplifiers, means including a common terminal for supplying A.C. power of the same frequency to said first and second stages, said second stage comprising a load circuit, first and second saturable reactor branches connected to controllably supply power to said load circuit, each said branch including a magnetic core, a winding on said core with a tap between first and second portions thereof, and a rectifier in series with said first winding portion, said taps being coupled to said common terminal, said rectifiers being similarly poled with respect to supply voltages applied to said common terminal, said rectifiers being oppositely poled with respect to said load circuit, said first stage amplifier comprising third and fourth saturable reactor branches connected in parallel to said common terminal for energization thereof with A.C. supply, each said third and fourth branches including in series a rectifier and a load winding, magnetic core means carrying the load windings of the third and fourth branches, said rectifiers in the third and fourth branches being conductive on half cycles of the same polarity of supply voltages applied across said branches, each of said first stage branches including as a load thereon said second winding portion of a different one of said second stage windings to increase the output of the first winding portion coupled to that second winding portion as the output of that first stage branch increases, and input drive means for the first stage responsive to signals of variable sense and including control winding means associated with said first stage magnetic core means for unequally driving said respective third and fourth branches in response to a signal of any given sense, the rectifiers of the respective first and second stages being conductive on half cycles of respectively opposite polarity of the applied supply voltages at any given time whereby control of the second stage is provided during the non-conductive half cycle of the second stage and the conductive half cycle of the first stage.

10. In a half-wave magnetic amplifier apparatus, a first magnetic amplifier having first power input means for receiving A.C., a second magnetic amplifier having second power input means for receiving A.C., means for supplying A.C. of the same frequency to said first and second power input means, said first amplifier comprising a pair of parallel-connected load circuit arms respectively arranged to conduct load current during half-cycles of given polarity of applied A.C., each load circuit arm comprising a rectifier and reactor load winding in series therewith, the rectifiers being similarly poled with respect to A.C. applied across said parallel connected arms, magnetic core means having wound thereon said load windings, said second amplifier comprising first and second magnetic cores and four bridge-connected impedance arms having conjugate terminals forming a load diagonal for supplying a load and a power input diagonal for receiving A.C., each of the pair of adjacent arms connected to one of the terminals of said power input diagonal including a reactor load winding on a different one of said first and second cores and a rectifier in series therewith, said rectifiers in the latter arms being similarly poled with respect to A.C. supplied to said power input diagonal and arranged to conduct load current during half-cycles of said A.C. which are of polarity opposite to said given polarity, first and second control windings wound respectively on said first and second cores, each of said load circuit arms of said first amplifier including a different one of said first and second control windings to increase the output of the load winding on the core carrying that control winding as the output of that load circuit arm increases, a source of electrical signals of variable magnitude and reversible sense, and control winding means for the magnetic core means of said first amplifier, said control winding means being connected to said signal source and arranged to vary the relative average currents conducted by the circuit arms of said first amplifier according to the magnitude and sense of said signal, whereby the relative flux levels in the cores of said second amplifier are set on said second amplifier's non-conducting half-cycle so that on the succeeding half-cycle the arm for one core of said second amplifier may conduct load current in advance of a tendency for the arm on the other core to conduct such current, or vice-versa, depending on said signal sense, said signal magnitude determining the extent of said advance.

11. In a magnetic amplifier having first and second reactor branches joined together at one end of each with the other ends thereof arranged for connection across a source of A.C., wherein one end of a load circuit is connected to the junction between said branches, and wherein each branch includes a saturable reactor load winding in series with a rectifier and a common point between the winding and the rectifier, and wherein said rectifiers are similarly poled with respect to power supplied across said other ends and the rectifiers have a common connection at said junction, the combination therewith of a shunt across said rectifiers and including in series a reactor and resistor connected from one to the other of said common points.

12. In a magnetic amplifier in which first and second saturable reactor branches are connected in parallel across an input circuit connectable to an A.C. power supply source, each branch including a rectifier in series with a reactor load winding carried by magnetic core means, said rectifiers being conductive on half cycles of the same polarity of A.C. supplied across said branches, and wherein a terminal common to said branches and to said rectifiers is connected to like electrodes of said rectifiers, the combination therewith of an intermediately tapped resistor connected across the not common terminals of said rectifiers, and a source of current connected to said intermediate tap and the common terminal of said rectifiers.

13. Amplifying apparatus comprising first and second stage magnetic amplifiers, means including a common terminal for supplying A.C. power of the same frequency to said first and second stages, said second stage comprising a load circuit, first and second saturable reactor branches connected to controllably supply power to said load circuit, each said branch including a magnetic core, a winding on said core with a tap between first and second portions thereof, and a rectifier in series with said first winding portion, said taps being coupled to said common terminal, said rectifiers being similarly poled with respect to supply voltages applied to said common terminal, said rectifiers being oppositely poled with respect to said load circuit, said first stage amplifier comprising third and fourth saturable reactor branches connected in parallel to said common terminal for energization thereof with A.C. supply, each said third and fourth branches including in series a rectifier and a load winding with an intermediate tap, a resistor connected between said intermediate taps of the first stage load windings, magnetic core means carrying the load windings of the third and fourth branches, said rectifiers in the third and fourth branches being conductive on half cycles of the same polarity of supply voltages applied across said branches, each of said first stage branches including as a load thereon said second winding portion of a different one of said second stage windings to increase the output of the first winding portion coupled with that second winding portion as the output of that first stage branch increases, and input drive means for the first stage responsive to signals of variable sense and including control winding means associated with said first stage magnetic core means for unequally driving said respective third and fourth branches in response to a signal of any given sense, the rectifiers of the respective first and second stages being conductive on half cycles of respectively opposite polarity of the applied supply voltages at any given time whereby control of the second stage is provided during the nonconductive half cycle of the second stage and the conductive half cycle of the first stage.

14. Amplifying apparatus, comprising first and second stage magnetic amplifiers, means including a common terminal for supplying A.C. power of the same frequency to said first and second stages, said first amplifier comprising a pair of parallel-connected load circuit arms respectively arranged to conduct load current during half-cycles of given polarity of applied A.C., each load circuit arm comprising a rectifier and reactor load winding in series therewith, the rectifiers being similarly poled with respect to A.C. applied across said parallel connected arms, magnetic core means having wound thereon said load windings, said second amplifier comprising first and second magnetic cores and four bridge-connected impedance arms having conjugate terminals forming a load diagonal for supplying a load and a power input diagonal including a common terminal for receiving A.C., each of the pair of adjacent arms connected to said common terminal including a winding on a different one of said first and second cores with a tap between first and second portions of the winding and a rectifier in series with said first winding portion, said taps being coupled to said common terminal, said rectifiers in the latter arms being similarly poled with respect to A.C. supplied to said common terminal and arranged to conduct load current during half-cycles of said A.C. which are of polarity opposite to said given polarity, each of said load circuit arms of said first amplifier including said second winding portion of a different one of said bridge windings to increase the output of the first winding portion coupled with that second winding portion as the output of that load circuit arm increases, a source of electrical signal of variable magnitude and reversible sense, and control winding means for the magnetic core means of said first amplifier, said control winding means being connected to said signal source and arranged to vary the relative average currents conducted by the circuit arms of said first amplifier according to the magnitude and sense of said signal, whereby the relative flux levels in the cores of said second amplifier are set on said second amplifier's nonconducting half-cycle so that on the succeeding half-cycle the arm for one core of said second amplifier may conduct load current in advance of a tendency for the arm on the other core to conduct such current, or vice-versa, depending on said signal sense, said signal magnitude determining the extent of said advance.

References Cited in the file of this patent

UNITED STATES PATENTS

| | | |
|---|---|---|
| 2,403,891 | Lamm | July 9, 1946 |
| 2,677,796 | Geyger | May 4, 1954 |
| 2,697,194 | Brown | Dec. 14, 1954 |
| 2,715,203 | Morgan | Aug. 9, 1955 |
| 2,723,355 | Graham | Nov. 8, 1955 |
| 2,734,165 | Lufcy et al. | Feb. 7, 1956 |
| 2,740,888 | Zukin | Apr. 3, 1956 |
| 2,767,372 | Rowley et al. | Oct. 16, 1956 |